US011901300B2

(12) United States Patent
Gandhi et al.

(10) Patent No.: US 11,901,300 B2
(45) Date of Patent: Feb. 13, 2024

(54) UNIVERSAL INTERPOSER FOR A SEMICONDUCTOR PACKAGE

(71) Applicant: XILINX, INC., San Jose, CA (US)

(72) Inventors: Jaspreet Singh Gandhi, San Jose, CA (US); Brian C. Gaide, Erie, CO (US)

(73) Assignee: XILINX, INC., San Jose, CA (US)

( * ) Notice: Subject to any disclaimer, the term of this patent is extended or adjusted under 35 U.S.C. 154(b) by 192 days.

(21) Appl. No.: 17/677,899

(22) Filed: Feb. 22, 2022

(65) Prior Publication Data

US 2023/0268280 A1    Aug. 24, 2023

(51) Int. Cl.
*H01L 23/498* (2006.01)
*H01L 23/538* (2006.01)
*H01L 25/18* (2023.01)
*H01L 23/00* (2006.01)

(52) U.S. Cl.
CPC .... *H01L 23/5386* (2013.01); *H01L 23/49822* (2013.01); *H01L 23/49838* (2013.01); *H01L 24/06* (2013.01); *H01L 25/18* (2013.01); *H01L 2224/0612* (2013.01)

(58) Field of Classification Search
CPC ........... H01L 23/5386; H01L 23/49822; H01L 23/49838; H01L 24/06; H01L 25/18; H01L 2224/0612; H01L 25/0652; H01L 23/13; H01L 23/49816; H01L 23/49827; H01L 24/16
See application file for complete search history.

(56) References Cited

U.S. PATENT DOCUMENTS

2004/0209401 A1 * 10/2004 Lee ................ H01L 23/5386
438/460

* cited by examiner

*Primary Examiner* — Elias Ullah
(74) *Attorney, Agent, or Firm* — Patterson + Sheridan, LLP

(57) ABSTRACT

A universal interposer for an integrated circuit (IC) device has a body having a first surface and a second surface opposite the first surface. A first region is formed on a first side of the body along a first edge. The first region has first slots, each having an identical first bond pad layout. A second region is formed on the first side along a second edge, opposite the first edge. The second region has second slots having an identical second bond pad layout. A third region having third slots is formed on the first side between the first and second regions, each slot having an identical third bond pad layout. A pad density of the third bond pad layout is greater than the first bond pad layout. One of the third slots is coupled to contact pads disposed in a region not directly below any of the second slots.

20 Claims, 6 Drawing Sheets

UNIVERSAL INTERPOSER FOR A SEMICONDUCTOR PACKAGE

BACKGROUND

Technical Field

Examples of the present disclosure generally relate to a universal interposer having a plurality of slots with distinct bond pad layouts configured to interface with different IC devices of varying bond pad density.

Description of Related Art

Multi-die integrated circuits (ICs) are a class of ICs in which multiple dies are placed within a single chip package. A multi-die IC can include circuit structures that allow the dies to communicate with one another within the single package at faster speeds than would be attainable were the dies to be implemented as separately packaged ICs mounted on a printed circuit board. For example, one of the structures that can be used to facilitate the transfer of inter-die signals is an interposer on which one or more other IC dies can be mounted.

The interposer includes a core having through vias. Build up layers are fabricated on both sides of the core and include routing that allows the high density interconnects to the IC die to be fanned out to a lower density interconnect on the other side of the interposer to facilitate connection with a package substrate. The interposer is designed in an application specific manner according to the bond pad layout of each IC die that is to be attached to the interposer. As such, a new interposer design is typically required for each new chip package design. Thus, the need for application specific interposers drives up the development costs and design lead time needed to develop new chip packages.

Accordingly, there is a need for an improved interposer.

SUMMARY

A universal interposer having a plurality of regions, each region having a plurality of slots having distinct bond pad layouts configured to interface with different IC devices is disclosed herein. The different IC devices can have varying bond pad layouts and varying bond pad density. In one example, an interposer for an integrated circuit (IC) device has a body having a first surface and a second surface opposite the first surface. A first region is formed on a first side of the body along a first edge of the body. The first region has a plurality of first slots, each first slot has an identical first bond pad layout. A second region is formed on the first side of the body along a second edge of the body. The second edge is disposed opposite the first edge. The second region has a plurality of second slots, each second slot having an identical second bond pad layout. A third region is formed on the first side of the body between the first and second regions. The third region has a plurality of third slots, each third slot has an identical third bond pad layout. The third bond pad layouts have a pad density greater than a pad density of the first bond pad layouts. One of the plurality of third slots is spaced from a third edge of the body by at least one or more other third slots includes bond pads that are coupled to contact pads disposed along the first edge of the body. One of the plurality of third slots is disposed adjacent the third edge of the body that couples the first and second edges includes bond pads that are coupled to contact pads disposed along the second edge of the body in a region not directly below any of the second slots.

In another example, a chip package includes a package substrate and an interposer that has a body with a first surface and a second surface opposite the first surface. The second surface of the body is mechanically and electrically coupled to the interposer. The interposer further includes a first region formed on a first side of the body along a first edge of the body. The first region has a plurality of first slots, each first slot having an identical first bond pad layout. A second region is formed on the first side of the body along a second edge of the body. The second edge is disposed opposite the first edge. The second region has a plurality of second slots, each second slot having an identical second bond pad layout. A third region is formed on the first side of the body between the first and second regions. The third region has a plurality of third slots, each third slot having an identical third bond pad layout. The third bond pad layouts have a pad density greater than a pad density of the first bond pad layouts. One of the plurality of third slots spaced from a third edge of the body by at least one or more other third slots includes bond pads that are coupled to contact pads disposed along the first edge of the body. One of the plurality of third slots is disposed adjacent the third edge of the body that couples the first and second edges includes bond pads that are coupled to contact pads disposed along the second edge of the body in a region not directly below any of the second slots. At least a first integrated circuit (IC) die is mechanically and electrically coupled to bond pads of one of the third bond pad layouts formed in one of the third slots in the third region.

BRIEF DESCRIPTION OF THE DRAWINGS

So that the manner in which the above-recited features of the present disclosure can be understood in detail, a more particular description of the disclosure, briefly summarized above, may be had by reference to examples, some of which are illustrated in the appended drawings. It is to be noted, however, that the appended drawings illustrate only exemplary examples and are therefore not to be considered limiting of the scope of the disclosure, as the disclosure may admit to other equally effective examples. To facilitate understanding, identical reference numerals have been used, where possible, to designate identical elements that are common to the figures. It is contemplated that elements and features of one example may be beneficially incorporated in other examples without further recitation.

To facilitate understanding, identical reference numerals have been used, where possible, to designate identical elements that are common to the figures. It is contemplated that elements of one example may be beneficially incorporated in other examples.

DETAILED DESCRIPTION

The present disclosure relates to a universal interposer having a plurality of regions, each region having a plurality of slots having distinct bond pad layouts configured to interface with different IC devices of varying bond pad density. The regions are configured to allow attachment of certain types of IC devices, such that a variety of combinations of IC devices may be attached to the universal interposer in a plug and play manner. For example, a fabricator may connect between zero to N number of a first type of IC device in a first region, between zero to N number of a second type of IC device in a second region, and between zero to N number of a third type of IC device in a third region. The universal interposer enables a fabricator to assemble are large number of different chip packages using a single interposer design. In contrast, as a conventional interposer is purposed designed to interconnect with a specific IC device having a predetermined bond pad layout, it is unlikely that the same conventional interposer could be utilized in another chip package.

In contrast to the conventional interposer, the universal interposer disclosed herein can be used with a variety of IC devices having different functionality, and/or different bond pad layouts. Advantageously, the single universal interposer enables a single chip package having multiple types of IC devices with distinct functions, such as one or more memory devices, processing devices, and transceivers. Moreover, the universal interposer is scalable, providing multiple slots with distinct bond pad layouts capable of coupling one or more additional IC devices in a single region of slots. Because the universal interposer is configured in regions of common bond pad density, portions of a region configured for low pad density can be utilized for high pad density interconnections, thus making use of space that would be under-utilized in conventional interposer designs. For example, the universal interposer provides routing of transmission lines in regions that normally would be associated with memory interconnects. In this manner, the universal interposer is enabled to couple to multiple high density processing IC devices in a more efficient space utilization and design flexibility, resulting in faster time to market and diminished supply chain dependency.

Figure 1:
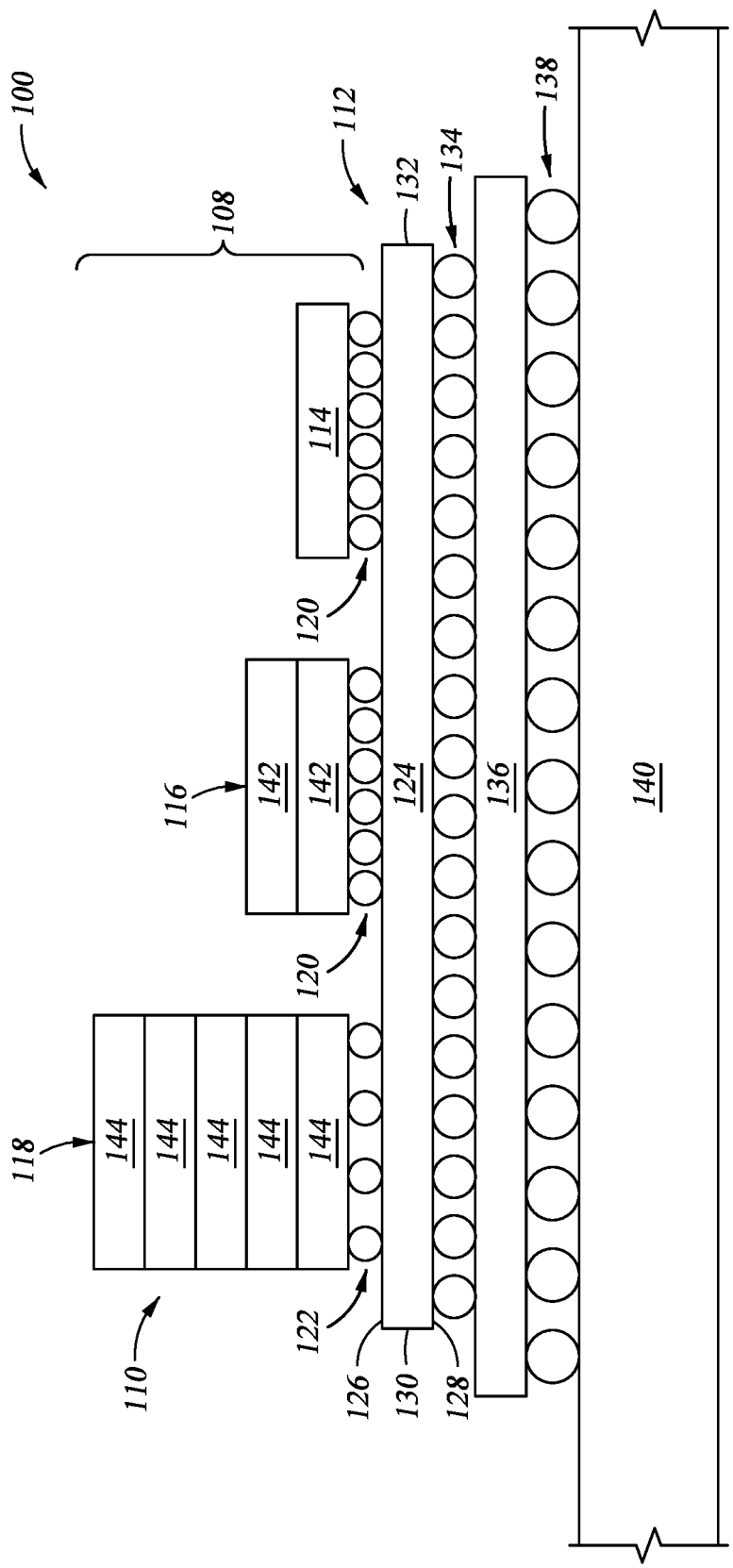
FIG. 1 is a front schematic view of an electronic device having an integrated chip package having a universal interposer.

FIG. 1 is a front schematic view of an electronic device 100 having an integrated circuit (IC) chip package 110 coupled to a printed circuit board (PCB) 140. The chip package 110 includes a universal interposer 112. The electronic device 100 may be a computer, tablet, cell phone, smart phone, consumer appliance, control system, automated teller machine, programmable logic controller, printer, copier, digital camera, television, monitor, stereo, radio, radar, or other electronic device incorporating the chip package 110.

The chip package 110 includes a plurality of integrated circuit (IC) devices 108. In FIG. 1, the plurality of IC devices 108 are shown electrically and mechanically connected by the universal interposer 112 to a package substrate 136. The plurality of IC devices 108 are coupled to the universal interposer 112 in at least three separate regions (as later described with reference to FIG. 2). The plurality of IC devices 108 coupled to the first region of the universal interposer 112 include one or more memory IC dies 118. The plurality of IC devices 108 coupled to the second region of the universal interposer 112 include one or more IC dies 114.

The plurality of IC devices 108 coupled to the third region of the universal interposer 112 include one or more primary processing IC dies 116. As noted, at least two of the one or more primary processing IC dies 116 can be identical in one example, and non-identical in another example. Accordingly, in one example, at least two of the one or more primary processing IC dies 116 are identical. In another example, at least two of the one or more primary processing IC dies 116 are not identical. In one example, at least two of the one or more primary processing IC dies 116 are identical. In another example, at least two of the one or more primary processing IC dies 116 are not identical.

Figure 2:
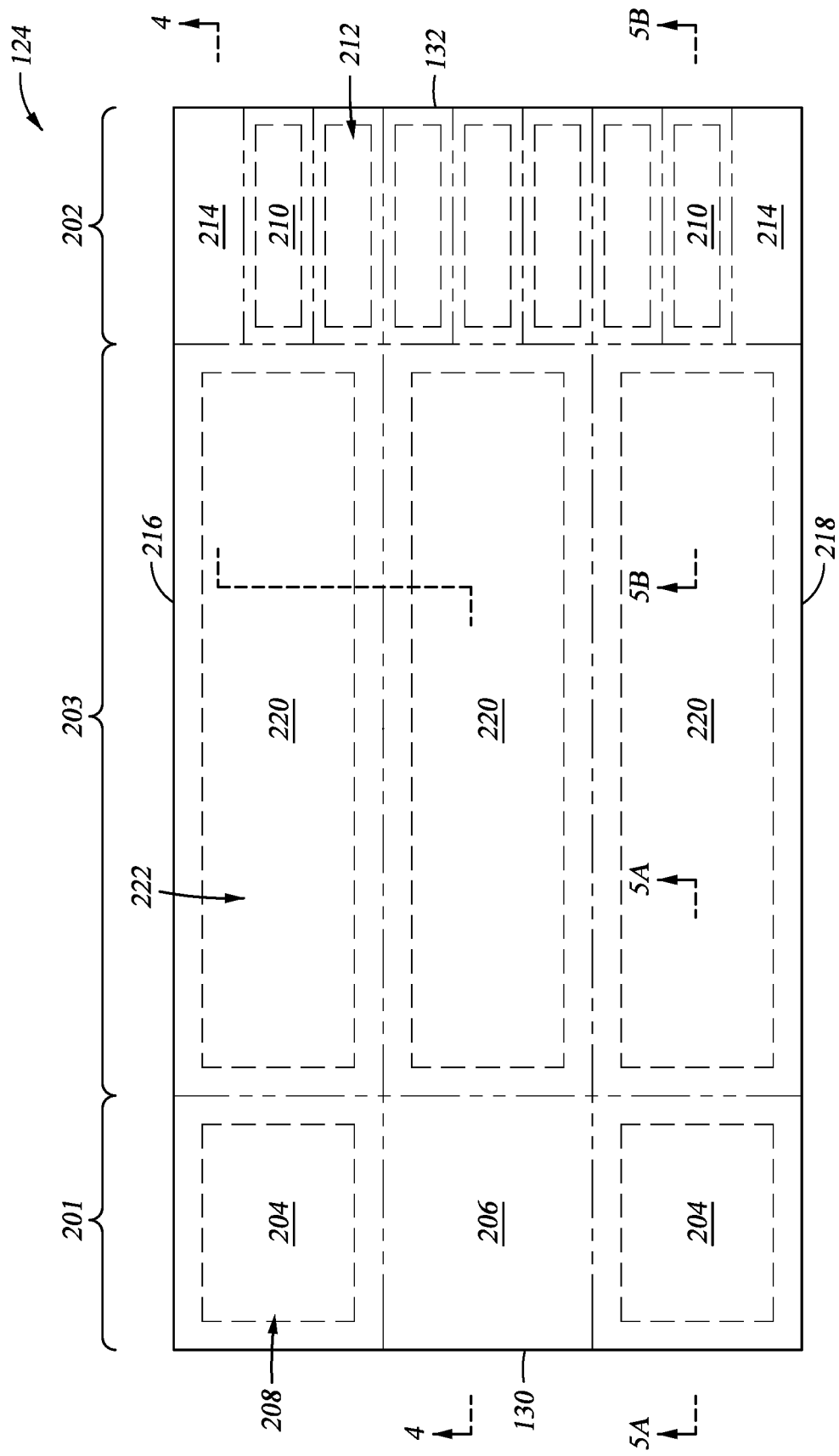
FIG. 2 is a top plan view of the first surface of the interposer shown in FIG. 1 having a plurality of bond pad layouts.

The chip package 110 may also have an overmold (not shown) covering the plurality of IC devices 108. The universal interposer 112 has a body 124 that has a first surface 126 and a second surface 128 opposite the first surface. The universal interposer 112 has a first edge 130 of the body 124 and a second edge 132 opposite the first edge 130. A third edge 216 of the body 124 and a fourth edge 218 of the body 124, opposite the third edge 216, are shown in FIG. 2. The third edge 216 and fourth edge 218 are substantially perpendicular to the first edge 130 and the second edge 132. The universal interposer 112 includes circuitry (shown in FIGS. 4, 5A and 5B) for electrically connecting the circuitry of the plurality of IC devices 108 to circuitry of the package substrate 136. The circuitry of the universal interposer 112 may optionally include active or passive circuit elements.

A plurality of high density micro-bumps 120 electrically and mechanically couple each of the IC dies 114, 116 to the first surface 126 of the universal interposer 112. The high density micro-bumps 120 electrically connect the circuitry of the IC die 114 and the circuitry of the primary processing IC die 116 to the circuitry of the universal interposer 112. The one or more memory IC dies 118 are electrically and mechanically coupled to the universal interposer 112 by a plurality of low density micro-bumps 122. The plurality of high density micro-bumps 120 have a greater density than the plurality of low density micro-bumps 122.

Integrated circuit (IC) interconnects 134, also known as "package bumps" or "C4 bumps," are utilized to provide an electrical and mechanical connection between the circuitry of the universal interposer 112 and the circuitry of the package substrate 136. The package substrate 136 may be mounted and connected to the PCB 140 utilizing solder connections, wire bonding or other suitable technique. In the example depicted in FIG. 1, the package substrate 136 is mounted to the PCB 140 using a plurality of solder balls 138.

The circuitry of the universal interposer 112 connects the high density micro-bumps 120 to selective IC interconnects 134, and hence, connects selective circuitry of each of the IC die 114 and the primary processing IC dies 116 to the package substrate 136. These connections enable communication from the dice the IC die 114 and the primary processing IC dies 116 with the PCB 140 after the chip package 110 is mounted within the electronic device 100.

In one example, one or more of the IC dies 114 is a chiplet that supports functionality of the primary processing IC die 116 or other portion of chip package 110. For example, as a chiplet, the IC die 114 can be a gigabit transceiver (GT). The gigabit transceiver (GT) can be programmed to conform to any of a variety of communication standards by programming communication signaling parameters, such as duty cycle, frequency, and preemphasis, among other known communication signaling parameters. The one or more IC dies 114 may also be a digital-to-analog converter (DAC), analog-to-digital converter (ADC), including an RF DAC and an RF ADC, a Network Interface Chip (NIC), a Compute Engine, a video transcoder, a storage accelerator, an input/output (I/O), a physical layer (PHY) interface, a smart network interface card (SmartNIC), a central processing unit (CPU), an HBM, or the like. Other types of chiplets that may be embodied in the IC die 114 include chiplets configured to connect to an anchor die via a standard PHY interface, and chiplets configured for parallel connection standards such as Open High Bandwidth Interface (OHBI), bunch of wires (BOW), Advanced Interface Bus (AIB), double data rate (DDR), Management Data Input/Output (MDIO), Low-voltage-IN-Package-INterCONnect (LIPINCON), Infinity Fabric on package (IFOP), Global memory interconnect (GMI), Ultra short reach (USR), and the like.

The one or more primary processing IC dies 116 can include one or more logic dies 142, such as for example, three logic dies 142, as illustrated in FIG. 1. For example, the logic die 142 may be a programmable logic device, such as a field programmable gate array (FPGA), optical device, processor, or other IC logic structure. Optical devices include photo-detectors, lasers, optical sources, and the like. An FPGA is characterized by the inclusion of programmable circuit blocks, include, but are not limited to, input/output blocks (IOBs), configurable logic blocks (CLBs), dedicated random access memory blocks (BRAM), digital signal processing blocks (DSPs), processors, clock managers, and delay lock loops (DLLs).

The one or more memory IC dies 118 can include one or more high bandwidth memory (HBM) dies 144. In some examples, one of the memory IC dies 118 closest to the first surface 126 is configured as an input/output (I/O) IC die 144, routing signals or data between the one or more other memory IC dies 118 and one or more of the primary processing IC die 116, and/or IC die 114 through the universal interposer 112.

FIG. 2 is a plan view of the first surface 126 of the universal interposer 112 shown in FIG. 1. The universal interposer 112 has a first region 201 adjacent the first edge 130, a second region 202 adjacent the second edge 132, and a third region 203 disposed between the first region 201 and the second region 202.

The first region 201 has a plurality of first slots 204 and at least one dummy slot 206. In FIG. 2, a single dummy slot 206 is disposed between the two of first slots 204. Each of the first slots 204 is configured to receive one of the first IC dies 118. In one example, first slots 204 are disposed in each side of the first region 201 adjacent the third and fourth edges 216, 218. The each of the plurality of first slots 204 have an identical first bond pad layout 208. For example, the first bond pad layout 208 has a low pattern bond pad density that is complimentary to the plurality of low density micro-bumps 122 that attach each bond pad to a corresponding contact pad of the primary processing IC dies 116 (when present). In one example, the dummy slot 206 is free of bond pads in a pattern that is complimentary to the plurality of low density micro-bumps 122 and high density micro-bumps 120. In another example, the dummy slot 206 is includes a pattern of dummy bond pads that are either grounded or electrically floating relative the circuitry of the package substrate 136.

The second region 202 has a plurality of second slots 210, and each second slot 210 has an identical second bond pad layout 212. Each of the second slots 210 is configured to receive one of the IC dies 114. In one example, second slots 210 are spaced from each side of the first region 201 adjacent the third and fourth edges 216, 218 by a peripheral dummy slot 214. The peripheral dummy slots 214 are disposed in the second region 202 and in one example, bound the plurality of second slots 210 therebetween. Optionally, one or more of the peripheral dummy slots 214 may be disposed in the second region 202 between two or more of second slots 210. In the example depicted in FIG. 2, one peripheral dummy slot 214 is disposed on the first surface 126 at the intersection of the second edge 132 and a third edge 216 substantially orthogonal to the second edge 132. Another peripheral dummy slot 214 is disposed at the intersection of the second edge 132 and a fourth edge 218 that is substantially orthogonal to the second edge 132. The third edge 216 and the fourth edge 218 are substantially parallel to one another. In one example, the peripheral dummy slots 214 are free of bond pads that would be complimentary to the plurality of low density micro-bumps 122 and/or the high density micro-bumps 120. In another example, the peripheral dummy slots 214 include dummy bond pads that would be complimentary to the plurality of low density micro-bumps 122 and/or the high density micro-bumps 120. The dummy bond pads disposed in the dummy slot 206 are either grounded or electrically floating relative the circuitry of the package substrate.

A plurality of third slots 220 is shown in the third region 203. In one example, each third slot 220 has an identical third bond pad layout 222. In another example, each third slot 220 is not identical, and can have a distinct bond pad layout 222. Each of the third slots 220 is configured to receive one of the primary processing IC dies 116. Additionally, each of the third bond pad layouts 222 has a pad density greater than a pad density of the first bond pad layouts 208. In some example, the second bond pad layout 212 can be equal to or less than the third bond pad layout 222. In another example, the second bond pad layout 212 is greater than the third bond pad layout 222.

Figure 3:
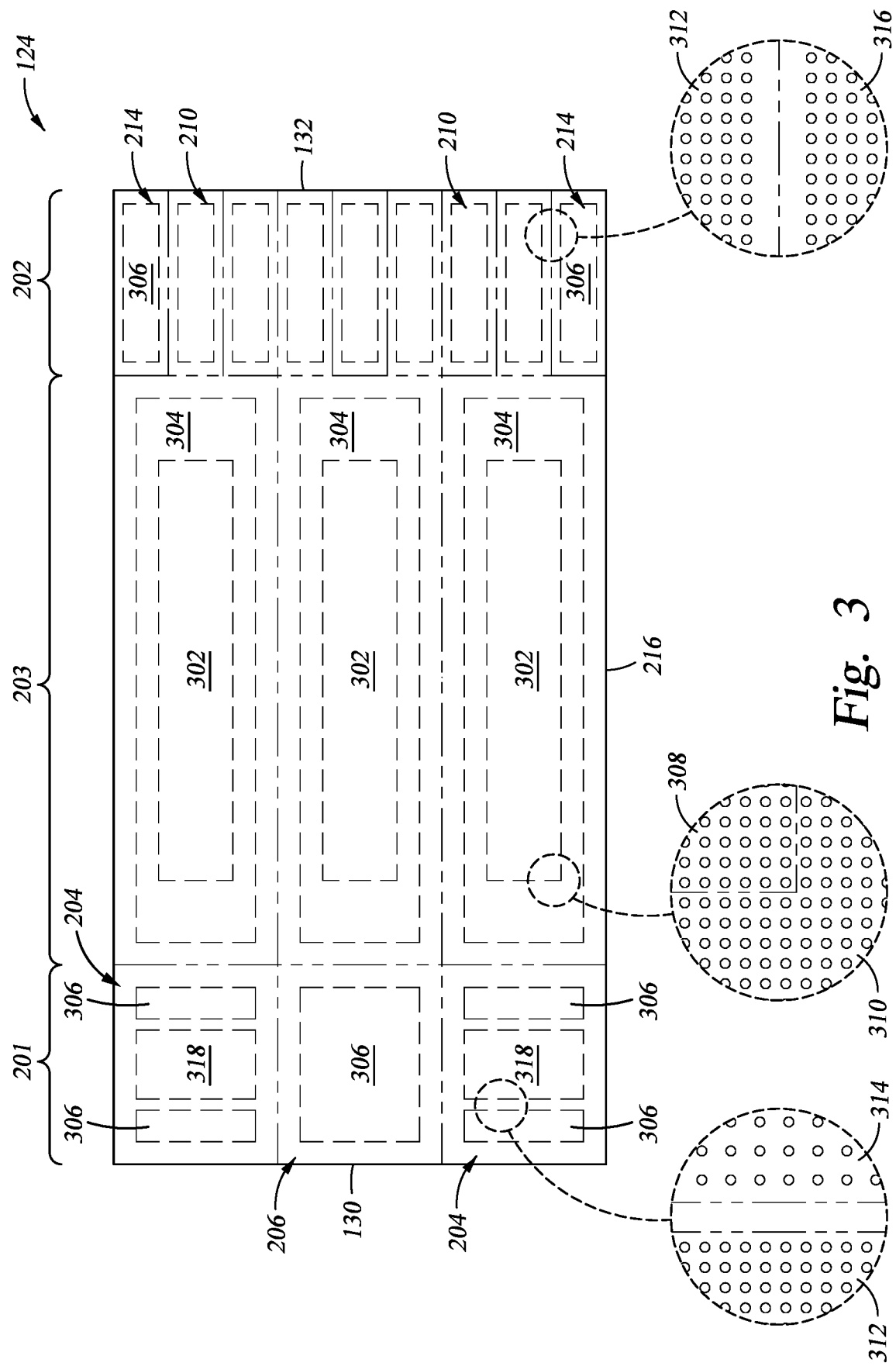
FIG. 3 is a bottom plan view of the second surface of the interposer, showing a plurality of contact pad layouts.

FIG. 3 is a plan bottom view of the second surface 128 of the universal interposer 112. Each of the first region 201, second region 202, and third region 203 extends through the body 124 to the bottom surface 128. Each of plurality of third slots 220 of the first surface 126 has a corresponding location on the second surface 128. Each third slot 220 on the second surface 128 includes an inner region 302 surrounded by an outer region 304. The inner region 302 includes bond pads primarily utilized for power and ground transmission. The outer region 304 includes bond pads primarily utilized for data transmission. In one example, the inner region 302 in each of the plurality of third slots 220 can have an identical inner contact pad layout 308. Similarly, it is understood that an identical outer contact pad layout 310 is disclosed for the outer region 304 of each of the plurality of third slots 220. In one example, the density of the contact pads that include outer contact pad layout 310 is the same as the density of the contact pads that include inner contact pad layout 308. In another example, the density of the contact pads including the outer contact pad layout 310 is greater than the density of the contact pads including the inner contact pad layout 308. One or more ground pads (not shown) can be disposed between some of the contact pads utilized for signal transmission in outer contact pad layout 310 to reduce cross-talk and/or diminish other performance issues, such as inductive coupling.

Each of plurality of first slots 204 of the first surface 126 has a corresponding location on the second surface 128. Each first slot 204 disposed on the first surface 126 includes a plurality of low density contact pads 314 disposed in a low density contact pad region 318 that are coupled through the circuitry of the universal interposer 112 to the bond pads of the bond pad layout 208 disposed in the corresponding first slot 204 located in the first surface 126 so that signals may be transmitted between the one or more memory IC dies 118 are coupled to bond pads in the plurality of first slots 204 and the universal interposer 112. The plurality of low density contact pads 314 are shown in the low density contact pad region 318.

Each first slot 204 disposed on the first surface 126 also includes a plurality of contact pads 312 disposed in a high density contact pad region 306 that are coupled through the circuitry of the universal interposer 112 to the bond pads disposed in one or more of third slot 220 located in the first surface 126 that is adjacent the corresponding first slot 204 so that signals may be transmitted between the one or more primary processing IC dies 116 are coupled to bond pads in the plurality of third slots 220 and the universal interposer 112.

In the example depicted in FIG. 3, each first slot 204 disposed on the first surface 126 includes at least two high density contact pad regions 306 on the bottom surface 128 of the body 124 of the universal interposer 112. The two high density contact pad regions 306 may be separated by at least one low density contact pad region 318. For example, one high density contact pad region 306 may be disposed immediately adjacent one of the edges 130, 216, 218. In another example, one high density contact pad region 306 may be disposed immediately adjacent the third region 203 and be separated from the edge 130 by at least the low density contact pad region 318. A density of contact pads 312 including the high density contact pad region 306 is greater than a density of low density contact pads 314 including the low density contact pad region 318. Although a gap or spacing is disposed between the contact pads 312 and the plurality of low density contact pads 314, the gap or spacing is not required.

Since the signal transmission from the primary processing IC dies 116 are provided through both the contact pads of the outer contact pad layout 310 of the outer region 304 of the third slot 220 and the contact pads 312 that include the high density contact pad region 306, the density of the contact pads that include outer contact pad layout 310 may be the equal to the density of the contact pads that include the high density contact pad region 306 of the first slot 204 and/or high density contact pad region 306 of the dummy slot 206. Alternatively, the density of the contact pads in the outer region 304 of the third slot 220 the contact pads 312 including the high density contact pad region 306 of one or both of the first slot 204 and dummy slot 206 of the first region 201 are different.

Additionally, some of the bond pads adjacent the third and fourth edges 216, 218 in the outer region 304 of the plurality of third slots 220 are connected to contact pads 312 disposed on the second surface 128 in one of the dummy slots 206. On the opposite side of the universal interposer 112, some of the bond pads disposed in the outer region 304 of the plurality of third slots 220 are connected to contact pads 316 disposed on the second surface 128 in one of the plurality of peripheral dummy slots 214. In one example, no bond pads disposed in the outer region 304 of the plurality of third slots 220 are connected to contact pads 312 disposed in one of the plurality of second slots 210 closest to the second edge 132 of the universal interposer 112. Generally, the bond pads disposed in the plurality of second slots 210 are connected to contact pads 312 disposed in the corresponding one of the plurality of second slots 210 on the second surface 128 of the universal interposer 112.

Figure 4:
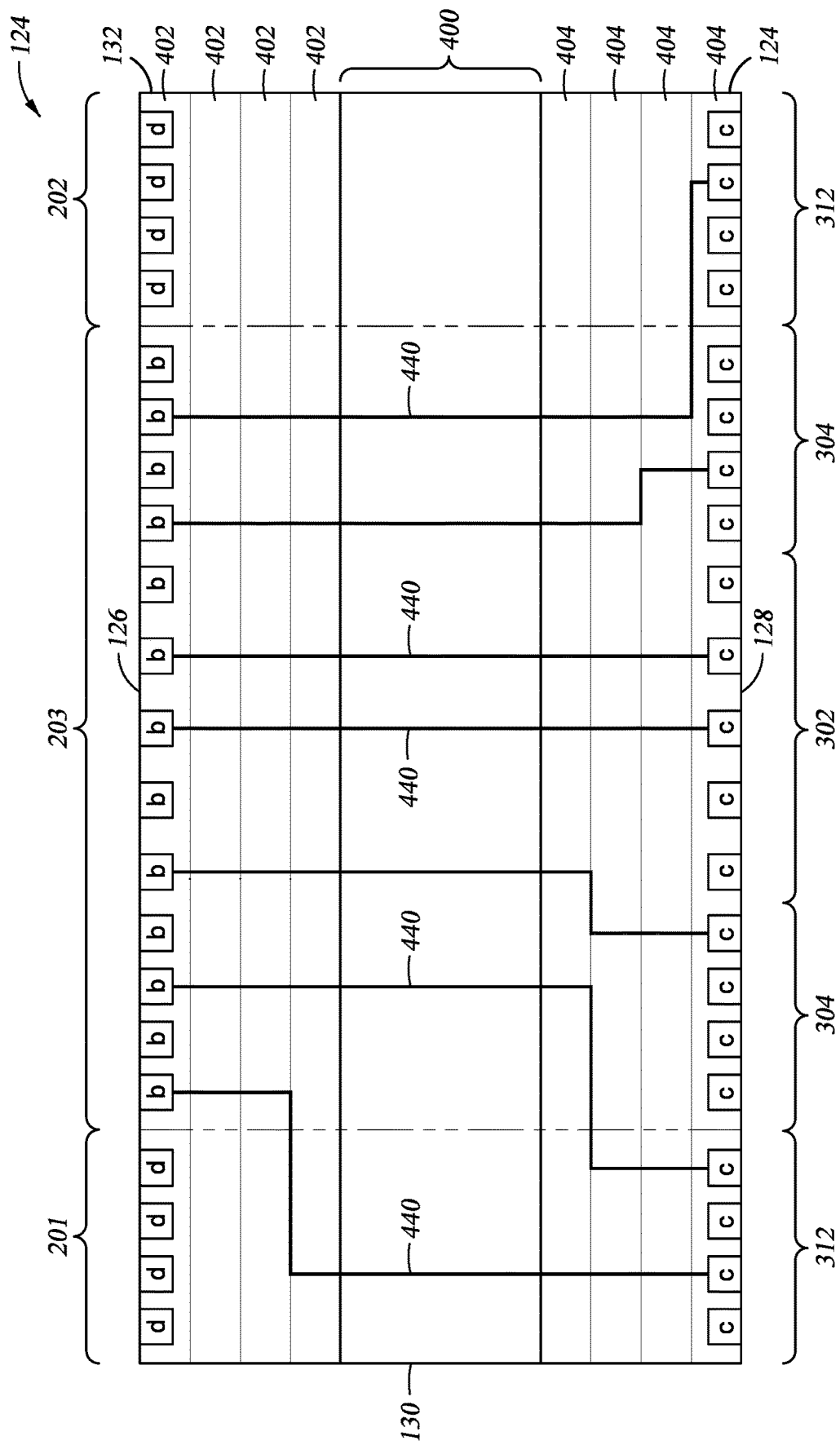
FIG. 4 is a sectional view of the body of the universal interposer taken along line 4-4 of FIG. 2.

FIG. 4 is a sectional view of the body 124 of the universal interposer 112 taken along section line 4-4 of FIG. 2. Section line 4-4 of FIG. 2 passes through the dummy slot 206 proximate the first edge 130, one of the plurality of third slots 220, and the dummy slot 214 proximate the intersection of the third edge 216 and second edge 132. The body 124 of the universal interposer 112 includes a core 400 disposed between the first plurality of dielectric layers 402 and the second plurality of dielectric layers 404. Although not explicitly shown, patterned metal lines and vias are disposed between the dielectric layers 402, 404 to form the interposer circuitry 440 of the universal interposer 112 that couples the bond pads (b) to the contact pads (c) on the first and second surfaces 126, 128 of the universal interposer 112. The dielectric layer 402 farthest from the core 400 forms the first surface 126 of the universal interposer 112, and similarly, the dielectric layer 404 farthest from the core 400 forms the second surface 128 of the universal interposer 112. While only four layers are shown in each of the dielectric layers 402, 404, it is understood that the number of layers shown are exemplary and that between two layers and seven layers or more layer can be disposed in either of the plurality of dielectric layers 402, 404.

The plurality of contact pads c is disposed on the second surface 128 and the plurality of bond pads b are disposed on the first surface 126. The plurality of bond pads b and the plurality of contact pads c can be any of the bond pads or contact pads disposed in the first region 201, second region 202, or third region 203. For example, the bond pads b shown in FIG. 4 are connected to the inner contact pads 308 and outer contact pads 310 shown in FIG. 3.

Dummy pads d are shown in the first surface 126 of the first region 201 and second region 202. The dummy pads d are disposed in the first surface 126 of the dummy slot 206 and the first surface 126 of the dummy slots 214, as illustrated in FIG. 2. Dummy pads d may have a similar pad density as the bond pads b, thus advantageously providing a substantially uniform metal density across the first surface 126. In one example, dummy pads d are not electrically connected to the contact pads c, bond pads b, or other circuitry of the universal interposer 112. Advantageously, by providing a metal density across the first surface 126, the universal interposer 112 is more resistant to warpage, cracking, and solder failure compared to conventional interposers.

In one example, the inner region 302 of contact pads c is surrounded by the contact pads c of the outer region 304. The inner region 302 of contact pads c are primarily used for power and ground transmission. The interposer circuitry 440 coupling the plurality of power and ground contact pads c and bond pads b may be predominately straight, i.e., only extend in a perpendicular direction relative to the first surface 126. Advantageously, the straight orientation of the interposer circuitry 440 conducting the power and ground through the universal interposer 112 helps to limit inductance and parasitic capacitance within the power delivery network of the chip package 110.

As noted above, some of the contact pads 312 are coupled to respective bond pads in the third region 203, the bond bonds having the third bond pad layout 222. The interposer circuitry 440 is fanned out horizontally, i.e., parallel or orthogonal to the first surface 126, utilizing the metal lines and vias disposed between the plurality of dielectric layers 402, 404.

One of the plurality of third slots 220 in the third region 203 that is adjacent to the third edge 216 of the body 124 (shown in FIG. 3) includes bond pads b that are coupled by the interposer circuitry 440 to contact pads c that are disposed along the first edge 130 in the first region 201, illustrated in FIG. 4. The contact pads c are disposed beneath the dummy slot 206 arranged on the first surface 126, as illustrated in FIG. 2. Accordingly, some of the contact pads 312 are disposed in the first region 201 as the contact pads c shown on the bottom surface 128. Another one of the plurality of third slots 220 in the third region 203 that is proximate the fourth edge 218 of the body 124 (shown in FIG. 3) couples to contact pads c on the second surface 128 in the second region 202, as shown in FIG. 4. The contact pads c in the second region 202 are disposed beneath the peripheral dummy slot 214, shown in FIG. 2. It is understood that a remaining one of the plurality of third slots 220 that is adjacent to fourth edge 218 similarly has contact pads c disposed beneath the peripheral dummy slot 214 that is proximate the fourth edge 218.

Figure 5A:
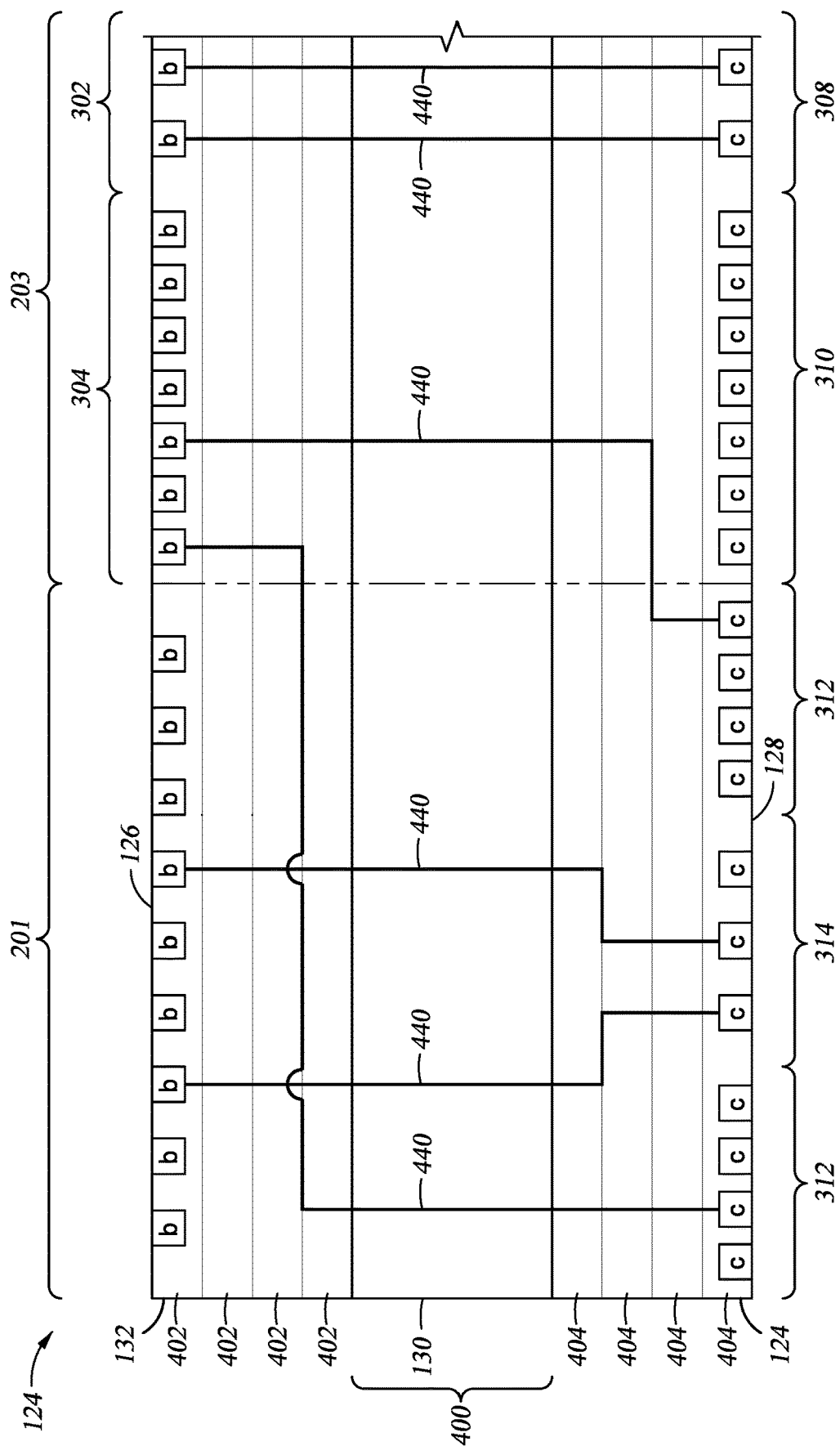
FIG. 5A is a sectional view of a first side of the body of the universal interposer taken along line 5A-5A of FIG. 2.

FIG. 5A is a partial sectional view of the body 124 of the universal interposer 112 taken along section line 5A-5A of FIG. 2. Section line 5A-5A passes through the one of the first slots 204 and a portion of one of the third slots 220.

FIG. 5A has been simplified, but it is understood that each of the bond pads b on the first surface 126 of the first region 201 will couple to a respective contact pad c on the bottom surface 128 via the interposer circuitry 440. Bond pads b in the first region 201 are coupled to the low density contact pads 314 via the interposer circuitry 440. The low density contact pads 314 can have a pad density that is less than a density of the bond pads b disposed in the first bond pad layout 208 shown in FIG. 2. Additionally shown in FIG. 5A, the low density contact pads 314 are disposed between the two groups of contact pads 312 in the first region 201. As such, one group of contact pads 312 in the first region 201 is disposed proximate the first edge 130 of the body 124. Another group of the contact pads 312 in the first region 201 is disposed proximate the contact pads c in the outer region 304 of the third region 203, as illustrated.

Figure 5B:
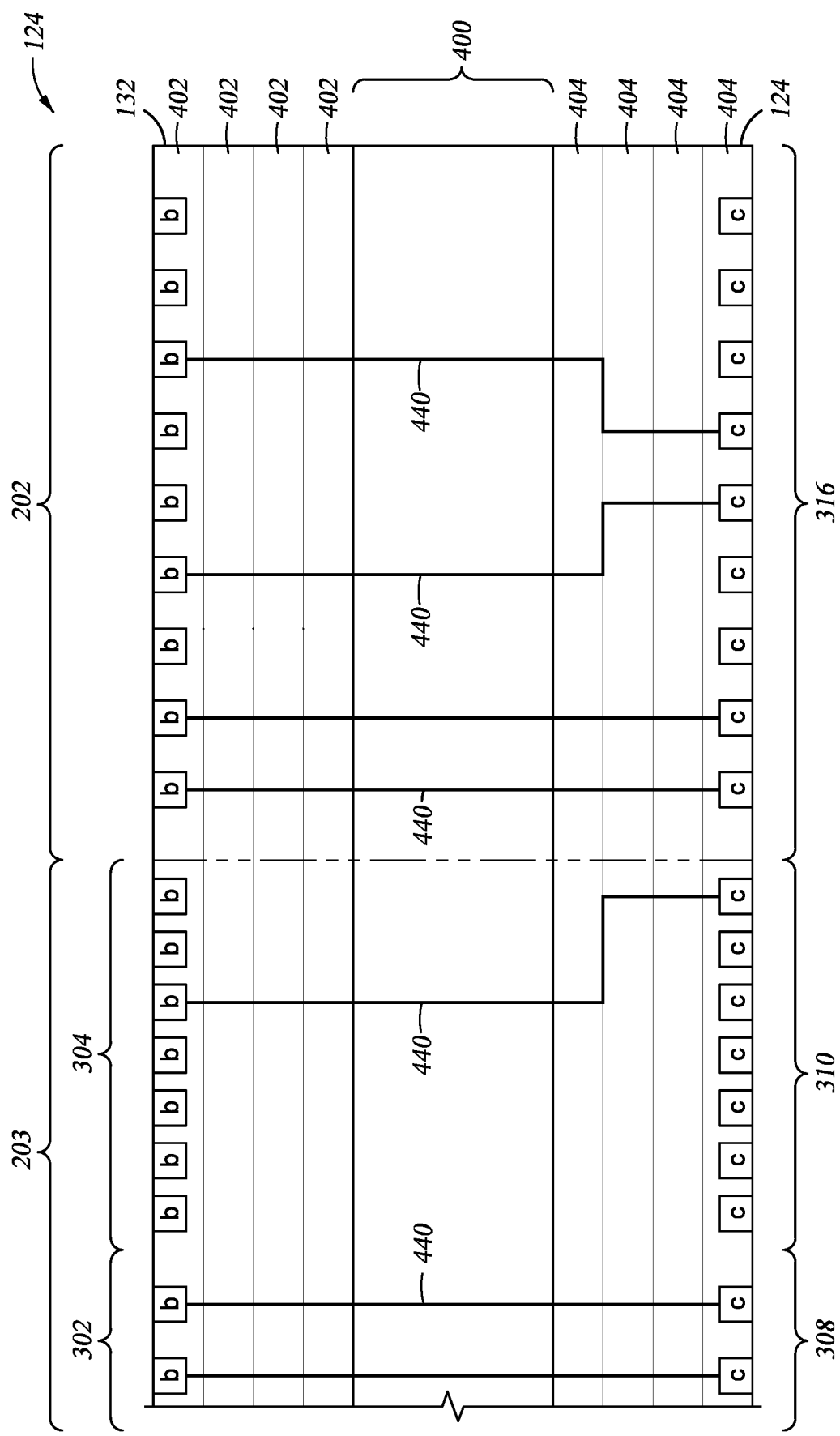
FIG. 5B is a sectional view of a second side of the body of the universal interposer taken along line 5B-5B of FIG. 2.

FIG. 5B is a partial sectional view of the body 124 of the universal interposer 112 taken along section line 5B-5B of FIG. 2. Section line 5B-5B passes through a portion of one of the third slots 220 disposed in the third region 203 and one the second slot 210 disposed in the second region 202. The interposer circuitry 440 is shown coupling bond pads b to contact pads c on the second surface 128 of the body 124 in the second region 202. Some portions of the interposer circuitry 440 is fanned out, while other portions of the interposer circuitry 440, such as portions carrying power signals, is not. The interposer circuitry 440 couples the plurality of die contact pads 316 (c) to bond pads b in the second slot 210, electrically coupling the package substrate 136 to the IC die 114, shown in FIG. 1.

Disclosed herein is a universal interposer having a plurality of slots with distinct bond pad layouts. The plurality of slots are configured to interface with different IC devices that can each have varying bond pad layouts and varying bond pad density. Advantageously, the universal interposer enables a plurality of different IC devices to access the circuitry of the universal interposer without requiring distinct and uniquely designed interposers or more complicated circuitry, thus reducing manufacturing time and production costs. While the foregoing is directed to examples of the present disclosure, other and further examples may be devised without departing from the basic scope thereof, and the scope thereof is determined by the claims that follow.

What we claim is:

1. An interposer for an integrated circuit (IC) device, comprising:
    a body having a first surface and a second surface opposite the first surface;
    a first region formed on a first side of the body along a first edge of the body, the first region having a plurality of first slots, each first slot having an identical first bond pad layout;
    a second region formed on the first side of the body along a second edge of the body, the second edge disposed opposite the first edge, the second region having a plurality of second slots, each second slot having an identical second bond pad layout; and
    a third region formed on the first side of the body between the first and second regions, the third region having a plurality of third slots, each third slot having an identical third bond pad layout; wherein:
    the third bond pad layouts have a pad density greater than a pad density of the first bond pad layouts; wherein:
    one of the plurality of third slots spaced from a third edge of the body by at least one or more other third slots includes bond pads that are coupled to contact pads disposed along the first edge of the body; and wherein:
    one of the plurality of third slots disposed adjacent the third edge of the body that couples the first and second edges includes bond pads that are coupled to contact pads disposed along the second edge of the body in a region not directly below any of the second slots.

2. The interposer of claim 1, wherein at least some of the bond pads of the one of the plurality of third slots spaced from the third edge of the body that are coupled to the contact pads disposed along the first edge of the body are in a region not directly below one of the first slots.

3. The interposer of claim 1, wherein at least some of the bond pads of the one of the plurality of third slots spaced from the third edge of the body that are coupled to the contact pads disposed along the first edge of the body are in a region directly below one of the first slots.

4. The interposer of claim 3, wherein at least some of the contact pads disposed along the first edge of the body that are in the region directly below one of the first slots are disposed between contact pads routed to bond pads residing in one of the first slots and contact pads routed to bond pads residing in one of the third slots.

5. The interposer of claim 3, wherein at least some of the contact pads disposed along the first edge of the body that are in the region directly below one of the first slots are disposed between contact pads routed to bond pads residing in one of the first slots and the first edge of the body.

6. The interposer of claim 3, wherein at least some of the contact pads disposed along the first edge of the body that are in the region directly below one of the first slots are disposed between contact pads routed to bond pads residing in one of the first slots and the first edge of the body.

7. The interposer of claim 1, wherein the third bond pad layouts further comprise:
    an inner region having a plurality of vias forming a substantially linear conductive path between the first surface and the second surface of the body; and
    an outer region having a fanned out conductive path between the first surface and the second surface of the body.

8. The interposer of claim 1, wherein the second region further comprises:
    at least two dummy slots each having an identical dummy bond pad layout, the dummy bond pad layouts have a pad density less than a pad density of the first bond pad layouts.

9. A chip package comprising:
a package substrate; and
an interposer comprising a body having a first surface and a second surface opposite the first surface, the second surface of the body mechanically and electrically coupled to the interposer, the interposer further comprising:
 a first region formed on a first side of the body along a first edge of the body, the first region having a plurality of first slots, each first slot having an identical first bond pad layout;
 a second region formed on the first side of the body along a second edge of the body, the second edge disposed opposite the first edge, the second region having a plurality of second slots, each second slot having an identical second bond pad layout; and
 a third region formed on the first side of the body between the first and second regions, the third region having a plurality of third slots, each third slot having an identical third bond pad layout; wherein:
 the third bond pad layouts have a pad density greater than a pad density of the first bond pad layouts; wherein:
 one of the plurality of third slots spaced from a third edge of the body by at least one or more other third slots includes bond pads that are coupled to contact pads disposed along the first edge of the body; and wherein:
 one of the plurality of third slots disposed adjacent the third edge of the body that couples the first and second edges includes bond pads that are coupled to contact pads disposed along the second edge of the body in a region not directly below any of the second slots; and
at least a first integrated circuit (IC) die mechanically and electrically coupled to bond pads of one of the third bond pad layouts formed in one of the third slots in the third region.

10. The chip package of claim 9 further comprising:
at least a second IC die mechanically and electrically coupled to bond pads of another one of the third bond pad layouts formed in one of the third slots in the third region, wherein the first and second IC dies are configured to swap positions.

11. The chip package of claim 9 further comprising:
at least a first high bandwidth memory (HBM) stack mechanically and electrically coupled to bond pads of one of the first bond pad layouts formed in one of the first slots in the first region.

12. The chip package of claim 11 further comprising:
at least a second HBM stack mechanically and electrically coupled to bond pads of another one of the first bond pad layouts formed in one of the first slots in the first region, wherein the first and second HBM stacks are configured to swap positions.

13. The chip package of claim 9 further comprising:
at least a first chiplet or IC die mechanically and electrically coupled to bond pads of one of the second bond pad layouts formed in one of the second slots in the second region.

14. The chip package of claim 13 further comprising:
at least a second chiplet or IC die mechanically and electrically coupled to bond pads of another one of the second bond pad layouts formed in one of the second slots in the second region, wherein the first and second chiplets or IC dies are configured to swap positions.

15. The chip package of claim 13 further comprising:
wherein the first chiplet or IC die is selected from the group consisting of an RF digital-to-analog converter (DAC), an RF analog-to-digital converter (ADC), a Network Interface Chip (NIC), a Compute Engine, a video transcoder, a storage accelerator, an input/output (I/O), a physical layer (PHY) interface, and a gigabit transceiver.

16. The chip package of claim 13 further comprising:
wherein the first chiplet or IC die is a gigabit transceiver.

17. The chip package of claim 13, wherein the third bond pad layout further comprises:
 a first group of power routings disposed preferentially towards a center of the third bond pad layout relative to data routings of the third bond pad layout; and
 a second group of power routings disposed preferentially towards the center of the third bond pad layout relative to the data routings of the third bond pad layout, wherein one of the first group of power routings or the second group of power routings is coupled to a pair rail of the first IC die, and the other of the first group of power routings or the second group of power routings is not coupled to circuitry of the first IC die.

18. The chip package of claim 17, wherein the first group of power routings have a first average pitch between each power line in the first group of power routings, and the second group of power routings have a second average pitch between each power line in the second group of power routings, wherein the first average pitch and second average pitch are different.

19. The chip package of claim 18, wherein the first average pitch is greater than the second average pitch.

20. The chip package of claim 17, wherein the first group of power routings extend from the first surface to the second surface, and the second group of power routings extend from the first surface to the second surface, and wherein only one of the first group of power routings terminates at bond pads coupled to the first IC die, or the second group of power routings terminate at the bond pads coupled to the first IC die.

* * * * *